(12) United States Patent
Fujita

(10) Patent No.: US 7,521,278 B2
(45) Date of Patent: Apr. 21, 2009

(54) ISOLATION METHOD FOR LOW DARK CURRENT IMAGER

(75) Inventor: Hiroaki Fujita, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 184 days.

(21) Appl. No.: 11/550,137

(22) Filed: Oct. 17, 2006

(65) Prior Publication Data

US 2008/0090321 A1    Apr. 17, 2008

(51) Int. Cl.
    H01L 21/308    (2006.01)
    H01L 21/339    (2006.01)

(52) U.S. Cl. .................. 438/57; 438/433; 438/524; 438/73; 257/446; 257/E31.054; 257/E31.055; 257/E21.551

(58) Field of Classification Search ............ 438/57, 438/424, 433, 524, 525, 527, 529, 73, 75; 257/431, 443, 446, 466, E31.054, E31.055, 257/E21.551
See application file for complete search history.

(56) References Cited

U.S. PATENT DOCUMENTS

| | | | |
|---|---|---|---|
| 5,891,787 A | | 4/1999 | Gardner et al. |
| 6,177,333 B1 * | | 1/2001 | Rhodes ................ 438/433 |
| 6,921,705 B2 * | | 7/2005 | Choi et al. ............. 438/424 |
| 6,949,445 B2 * | | 9/2005 | Rhodes et al. ......... 438/424 |
| 7,241,671 B2 * | | 7/2007 | Han .................... 438/524 |
| 7,262,110 B2 * | | 8/2007 | Jin ..................... 438/424 |
| 7,358,108 B2 * | | 4/2008 | Han et al. .............. 438/60 |
| 7,397,100 B2 * | | 7/2008 | Jung .................... 257/446 |
| 7,439,155 B2 * | 10/2008 | Mouli et al. .......... 438/429 |
| 2004/0164227 A1 | 8/2004 | Ohta et al. |
| 2004/0178430 A1 * | 9/2004 | Rhodes et al. ......... 257/292 |
| 2004/0251481 A1 * | 12/2004 | Rhodes ................. 257/292 |
| 2005/0088556 A1 * | 4/2005 | Han .................... 348/308 |
| 2005/0179071 A1 * | 8/2005 | Mouli .................. 257/291 |
| 2006/0001043 A1 * | 1/2006 | Shim ................... 257/183 |
| 2006/0128126 A1 * | 6/2006 | Adkisson et al. ...... 438/525 |
| 2006/0138484 A1 | 6/2006 | Han |
| 2006/0273355 A1 * | 12/2006 | Han .................... 257/239 |
| 2007/0087463 A1 * | 4/2007 | Adkisson et al. ....... 438/48 |
| 2007/0128954 A1 * | 6/2007 | Itonaga ................ 439/852 |
| 2007/0141801 A1 * | 6/2007 | Kwon et al. ........... 438/400 |
| 2007/0221973 A1 * | 9/2007 | Nagasaki et al. ....... 257/292 |
| 2008/0042233 A1 * | 2/2008 | Kim .................... 257/519 |
| 2008/0251821 A1 * | 10/2008 | Ko et al. .............. 257/292 |
| 2008/0315273 A1 * | 12/2008 | Jung ................... 257/292 |

* cited by examiner

Primary Examiner—M. Wilczewski
(74) Attorney, Agent, or Firm—Peyton C. Watkins

(57) ABSTRACT

A method for forming the passivation layer for silicon-isolation interface between photosensitive regions of an image sensor, the method includes providing a substrate having a plurality of spaced apart photosensitive regions that collect charge in response to incident light; etching trenches in the substrate between the photosensitive regions; forming a plurality of masks over the photosensitive regions so that trenches between the photosensitive regions are not covered by the masks; implanting the image sensor with a first low dose to passivate the trenches; filling the trenches with a dielectric to form isolation between the photosensitive regions; forming a plurality of masks which cover the photosensitive regions but does not cover a surface corner of the isolation trench to permit passivation implantation at the surface corner of the trench isolation; and implanting the image sensor at a second low dose to passivate the surface corner of trenched isolation region.

3 Claims, 5 Drawing Sheets

ISOLATION METHOD FOR LOW DARK CURRENT IMAGER

FIELD OF THE INVENTION

The invention relates generally to the field of image sensors, and more particularly to such image sensors with an isolation trench for substantially reducing dark current.

BACKGROUND OF THE INVENTION

Currently, prior art image sensors reduce cross talk between photodiodes or photosensitive areas by forming local oxidation of silicon (generally referred to as LOCOS) between adjacent photodiodes. LOCOS are generally wide so that valuable surface area is consumed by the LOCOS.

Shallow trench isolation (STI) is generally narrower in width than LOCOS which reduces that amount of surface area consumed. However, forming a STI between photodiodes produces the drawback of undesirable defects, such as damage to the portion of the epitaxial layer in which the STI is formed.

Consequently, a need exists for having an image sensor with STI for consuming less surface area without the drawbacks of damaging the epitaxial layer and lowering saturation of the photodiode. The present invention provides this solution.

SUMMARY OF THE INVENTION

The present invention is directed to overcoming one or more of the problems set forth above. Briefly summarized, according to one aspect of the present invention, the invention resides in a method for forming the passivation layer for silicon-isolation interface between photosensitive regions of an image sensor, the method comprising: providing a substrate having a plurality of spaced apart photosensitive regions that collect charge in response to incident light; etching trenches in the substrate between the photosensitive regions; forming a plurality of masks over the photosensitive regions so that trenches between the photosensitive regions are not covered by the masks; implanting the image sensor with a first low dose to passivate the trenches; filling the trenches with a dielectric to form isolation between the photosensitive regions; forming a plurality of masks which cover the photosensitive regions but does not cover a surface corner of the isolation trench to permit passivation implantation at the surface corner of the trench isolation; and implanting the image sensor at a second low dose to passivate the surface corner of trenched isolation region.

The above and other objects of the present invention will become more apparent when taken in conjunction with the following description and drawings wherein identical reference numerals have been used, where possible, to designate identical elements that are common to the figures.

ADVANTAGEOUS EFFECT OF THE INVENTION

The present invention has the following advantage of providing an image sensor with STI for efficient use of image surface area that also has low dark current and also avoids having low saturation.

DETAILED DESCRIPTION OF THE INVENTION

In the present invention, it is beneficial to define certain terms in order to facilitate understanding of the present invention. In this regard, low dose concentration is defined as a concentration of at least or less than $2.0 \times 10^{13}$.

Figure 1:
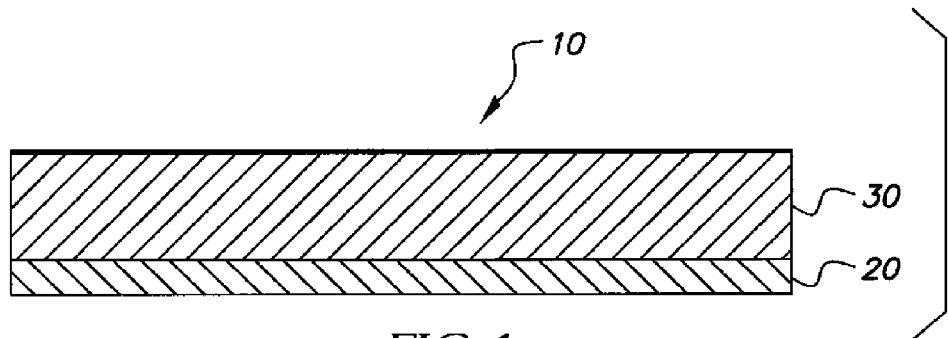
FIG. 1 is a side view of the image sensor of the present invention.
Figure 2:
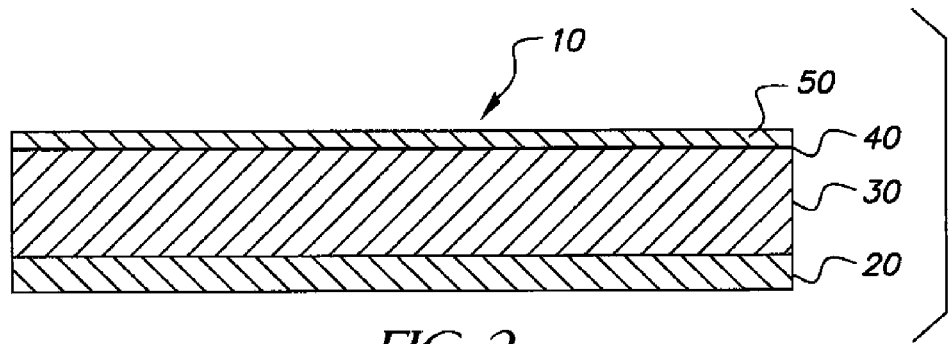
FIG. 2 is a side view illustrating formation of a silicon nitride layer.
Figure 3:
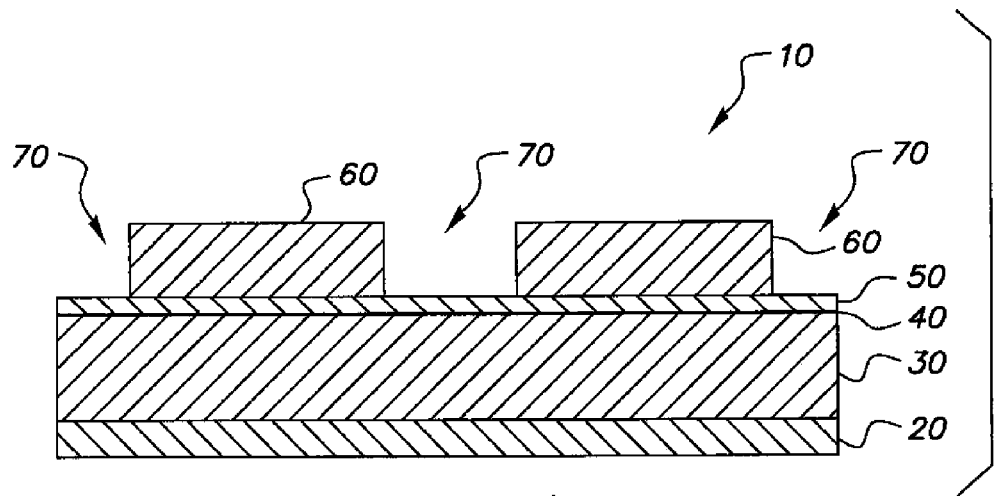
FIG. 3 is a view illustrating formation of photoresist.
Figure 4:
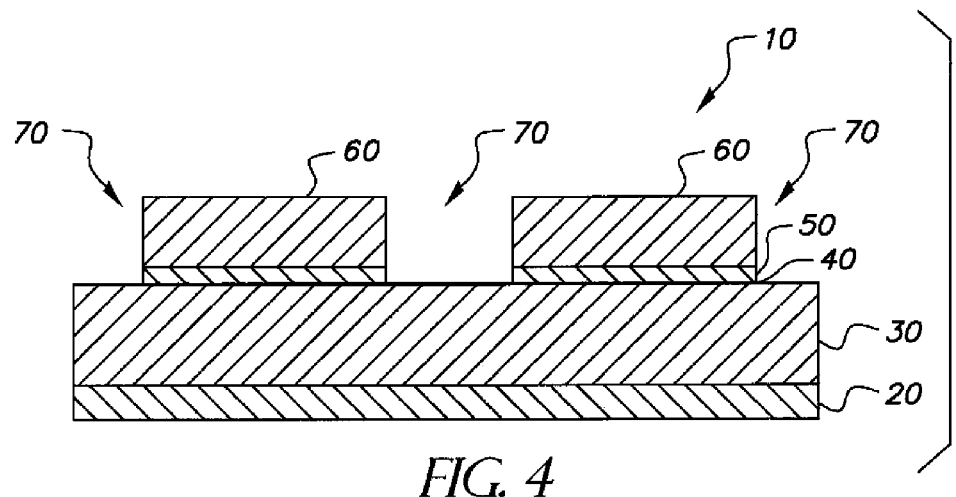
FIG. 4 is a side view illustrating etching of the silicon nitride and pad oxide layers.

Referring to FIG. 1, there is shown a side view of the image sensor 10 of the present invention. The image sensor 10 includes a p-type substrate 20 and a p-epitaxial layer 30 disposed thereon. Referring to FIG. 2, a layer of silicon dioxide (Sio2) 40 is grown on the surface by reacting silicon and oxygen at a predetermined high temperature. A layer of silicon nitride 50 is deposited on the silicon dioxide 40 preferably using chemical vapor deposition. Referring to FIG. 3, a layer of photoresist 60 is selectively patterned over the silicon nitride 50; the photoresist 60 is patterned in a spaced-apart relationship so that gaps 70 exist in the photoresist 60. Referring to FIG. 4, the silicon nitride 50 and silicon dioxide 40 are both etched to match the pattern of the photoresist 60.

Figure 5:
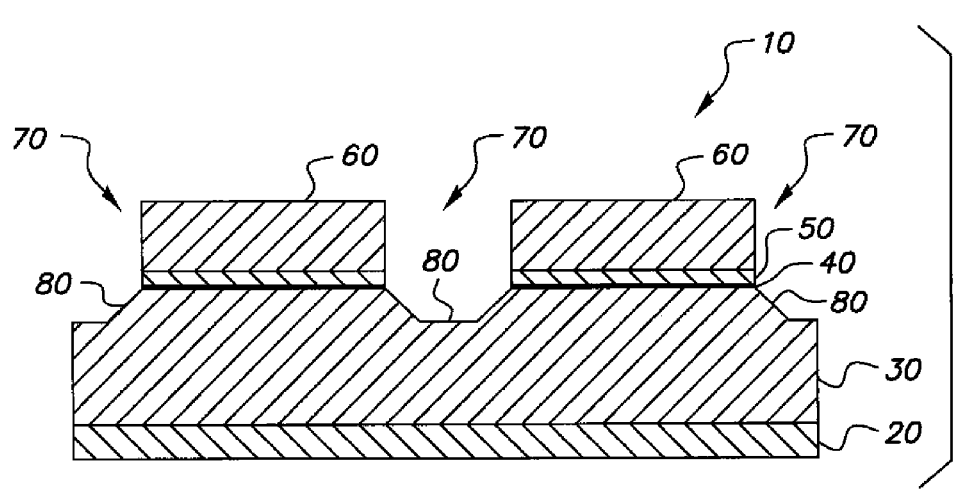
FIG. 5 is a side view illustrating the etch of isolation trenches.
Figure 6:
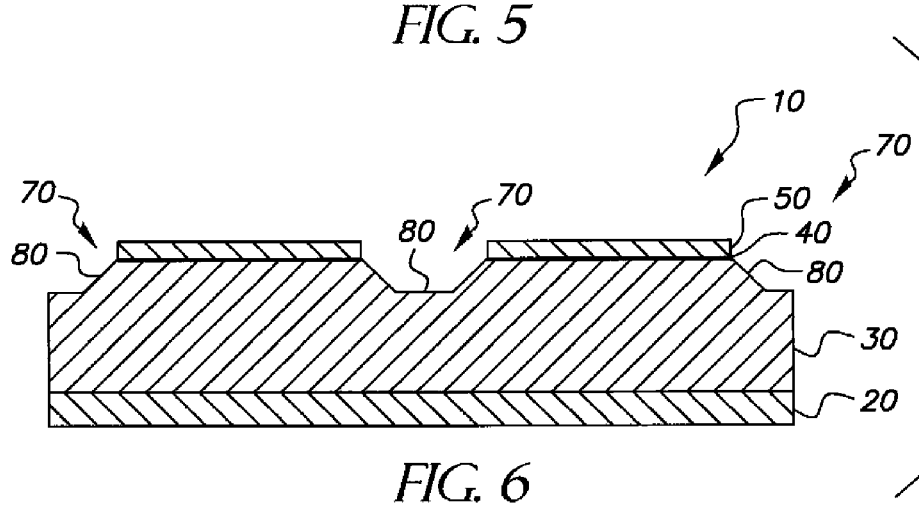
FIG. 6 is a side view illustrating removal of the photoresist.

Referring to FIG. 5, the p-epitaxial layer 30 is etched in the gaps 70 left by the previous matched etching described above. This forms a plurality of isolation trenches 80 which is preferably done using a reactive ion etch using fluorine chemistry. Referring to FIG. 6, the photoresist 60 is removed preferably by using oxygen plasma to burn of the resist layer.

Figure 7:
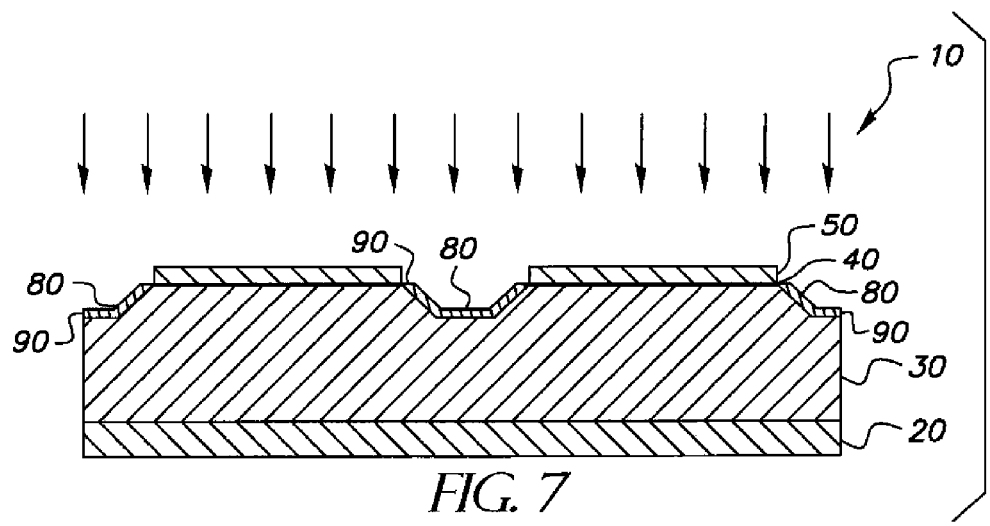
FIG. 7 is a side view illustrating a first implantation of the isolation trench.
Figure 8:
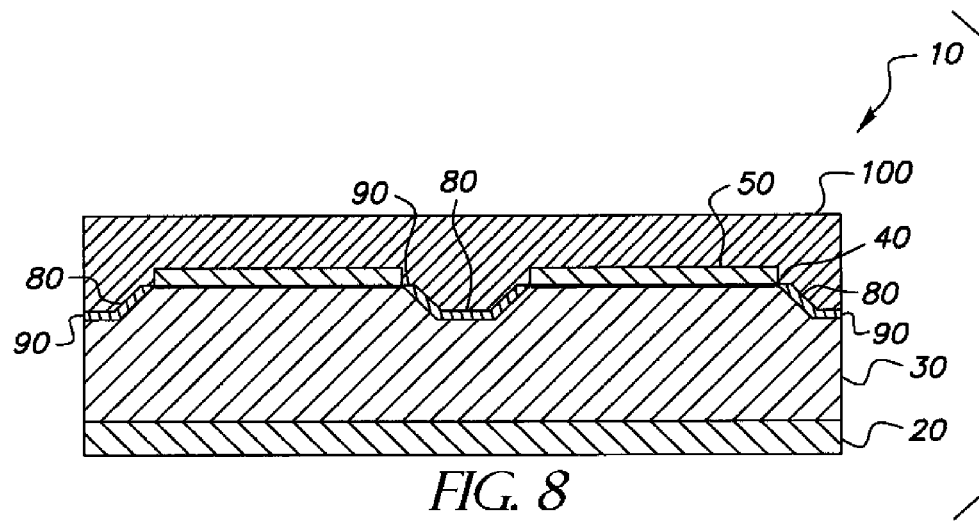
FIG. 8 is a side view illustrating formation of filling the trenches with oxide.
Figure 9:
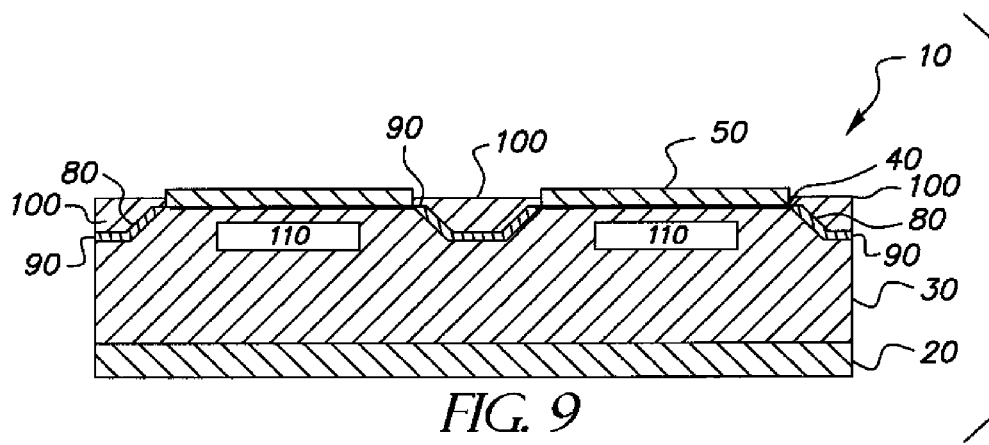
FIG. 9 is a side view illustrating polishing the oxide layer.
Figure 10:
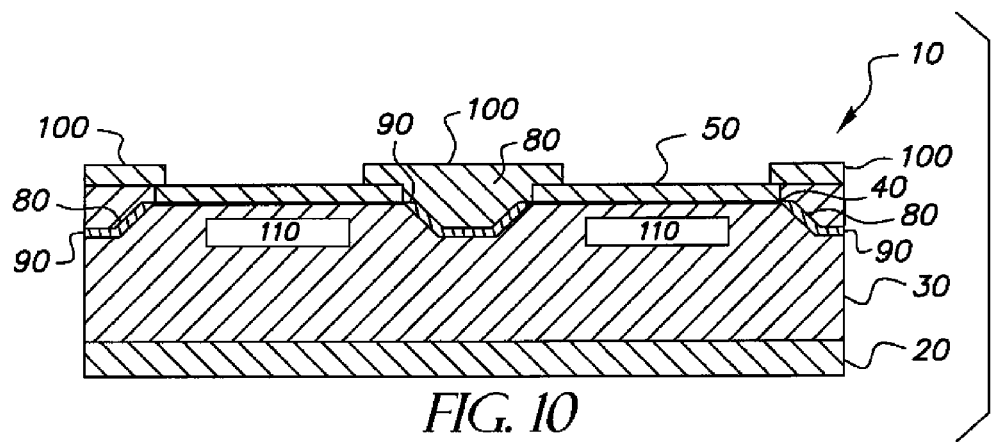
FIG. 10 is a side view illustrating removal of the silicon nitride layer.

Referring to FIG. 7, passivation implantation (illustrated by the arrows) at a plurality of angles is used to implant the surface (more specifically, the side surfaces and bottom surface) of the trench 80 at a low dose; preferably the entire implantation is at $1 \times 10^{13}$. FIG. 7 illustrates one angle implantation and this is repeated for the various angles. The silicon nitride layer 50 is used as a hard mask. Preferably, four angled implantations are used at this stage in which each implantation is at $2.5 \times 10^{12}$. This forms an arcuate-shaped or bowl-shaped passivation layer 90 of $p^+$ in the epitaxial layer. Referring to FIG. 8, a silicon dioxide layer 100 is deposited on the silicon nitride layer 50 that conformally fills the trenches 80. Referring to FIG. 9, this oxide layer 100 will prevent "crosstalk" between to-be active regions, preferably photodiodes; FIG. 9 actually illustrates the sites where photodiodes 110 will eventually be implanted since they are not physically implanted at this stage. This implantation is well known in the art and will not be described herein. The silicon dioxide layer 100 is selectively removed so that it remains only in the trenches 80. This silicon dioxide layer 100 is removed preferably using chemical mechanical polishing (CMP). Referring to FIG. 10, the silicon nitride layer 50 is removed preferably using a wet etch of hot phosphoric acid. This completes formation of the shallow trench isolation.

Figure 11:
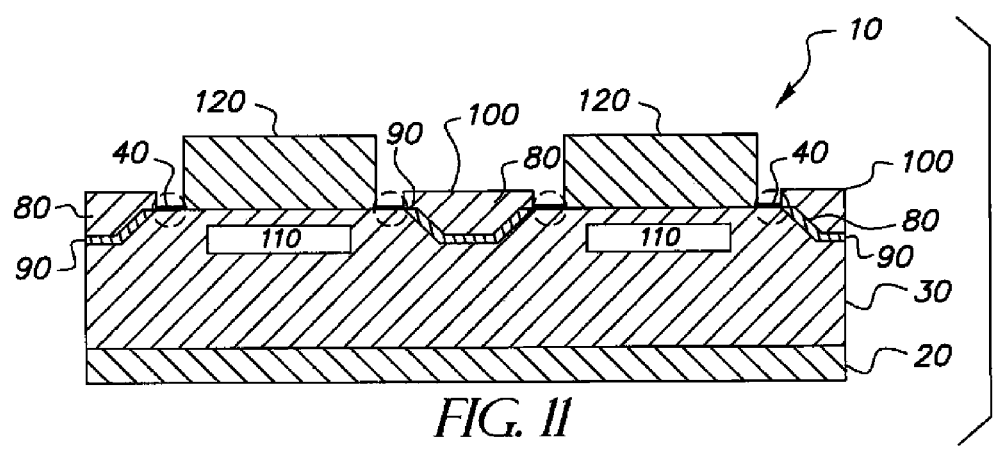
FIG. 11 is a side view illustrating adding photoresist for a subsequent second implantation.
Figure 12:
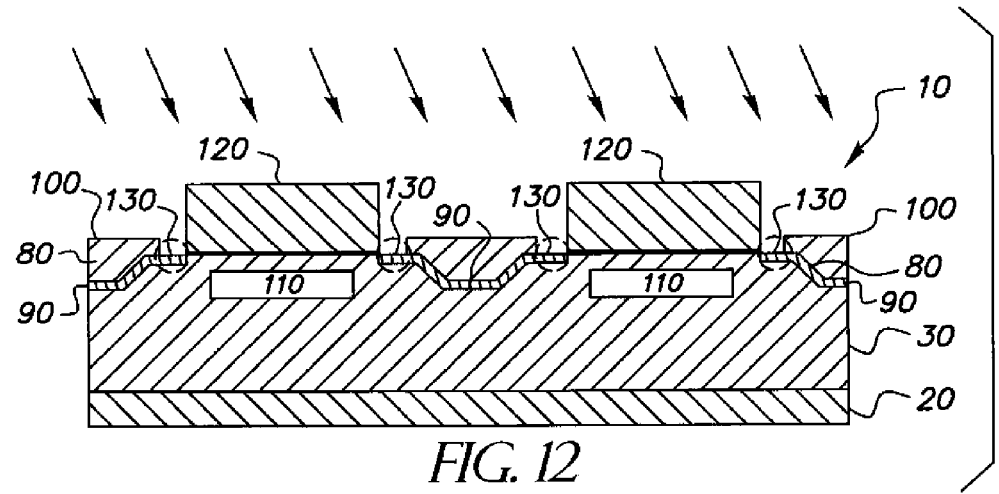
FIG. 12 is a side view illustrating implantation of the surface corners.

Referring to FIG. 11, a pattern of photoresist 120 is patterned over the sites where the photodiodes 110 will be made so that a space (illustrated by the circles) remains between the edge of the photoresist 120 and the edge of the trench 80 for reasons that will be shortly apparent. Referring to FIG. 12, passivation implantation at a plurality of angles is used to implant the surface corner of the trenched isolation region 130 (illustrated by the exposed surface region within the circles) at a low dose; preferably the entire implantation is at $1 \times 10^{13}$. The photoresist 120 and the silicon dioxide 100 in the trench 80 are used as masks. Preferably, four angled implantations are used at this stage in which each implantation is at $2.5 \times 10^{12}$.

Figure 13:
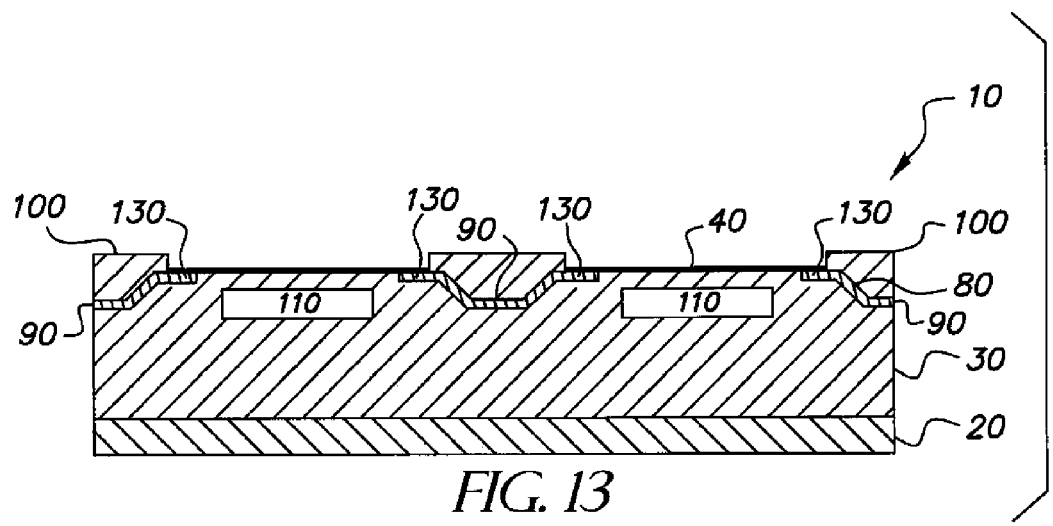
FIG. 13 is a side view illustrating removal of the photoresist.

Referring to FIG. 13, the photoresist 120 is removed and then image sensor 10 will then be completed, such as implantation of the photodiode 110, by traditional processes well known in the art. These steps, since they are well known, will not be described in detail herein.

Although the preferred embodiment implants twice at low dose concentrations, the implantation could occur more than twice, for example three or more times, as long as low concentration is maintained in both the trench and surface implant. In this regard, the trench could be implanted twice at some low dose concentration or concentrations, and the surface implant could be implanted one or more times at some low concentration or concentrations.

The invention has been described with reference to a preferred embodiment. However, it will be appreciated that variations and modifications can be effected by a person of ordinary skill in the art without departing from the scope of the invention.

PARTS LIST 10 image sensor
20 p-type substrate
30 p-epitaxial layer
40 silicon dioxide (Sio2) layer
50 silicon nitride layer
60 photoresist
70 gap
80 plurality of isolation trenches
90 arcuate-shaped or bowl-shaped passivation layer
100 silicon dioxide layer
110 photodiode
120 photoresist
130 trenched isolation region

The invention claimed is:

1. A method for forming the passivation layer for silicon-isolation interface between photosensitive regions of an image sensor, the method comprising:
    (a) providing a substrate having a plurality of spaced apart to-be formed photosensitive regions that collect charge in response to incident light;
    (b) etching trenches in the substrate between the to-be formed photosensitive regions;
    (c) forming a plurality of masks over the to-be formed photosensitive regions so that trenches between the to-be formed photosensitive regions are not covered by the masks;
    (d) implanting the image sensor with a first low dose to passivate the trenches;
    (e) filling the trenches with a dielectric to form isolation between the to-be formed photosensitive regions;
    (f) forming a plurality of masks which cover the to-be formed photosensitive regions but does not cover a surface corner of the isolation trench to permit passivation implantation at the surface corner of the trench isolation; and
    (g) implanting the image sensor at a second low dose to passivate the surface corner of trenched isolation region.

2. A method as in claim 1 wherein step (d) includes passivating a bottom and side of the trenches.

3. The method as in claim 1 further comprising the step of providing oxide as the dielectric.

* * * * *